(12) United States Patent  
Laermer et al.

(10) Patent No.: US 8,466,042 B2  
(45) Date of Patent: Jun. 18, 2013

(54) METHOD FOR MANUFACTURING SEPARATED MICROMECHANICAL COMPONENTS SITUATED ON A SILICON SUBSTRATE AND COMPONENTS MANUFACTURED THEREFROM

(75) Inventors: Franz Laermer, Weil der Stadt (DE); Kathrin Van Teeffelen, Stuttgart (DE); Christina Leinenbach, Ensdorf (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/994,092

(22) PCT Filed: Apr. 3, 2009

(86) PCT No.: PCT/EP2009/054037  
§ 371 (c)(1),  
(2), (4) Date: Feb. 22, 2011

(87) PCT Pub. No.: WO2009/141194  
PCT Pub. Date: Nov. 26, 2009

(65) Prior Publication Data  
US 2011/0163398 A1 Jul. 7, 2011

(30) Foreign Application Priority Data

May 23, 2008 (DE) .................. 10 2008 001 952

(51) Int. Cl.  
*H01L 21/301* (2006.01)

(52) U.S. Cl.  
USPC ..... 438/462; 438/463; 438/799; 257/E21.599

(58) Field of Classification Search  
USPC .. 438/462, 463, 799, FOR. 333; 257/E21.599  
See application file for complete search history.

(56) References Cited

U.S. PATENT DOCUMENTS

| | | | |
|---|---|---|---|
| 2004/0110359 A1 | 6/2004 | Blanc | |
| 2006/0141760 A1 | 6/2006 | Brandl | |
| 2007/0105345 A1* | 5/2007 | Kurosawa | 438/460 |
| 2009/0068798 A1* | 3/2009 | Oliver et al. | 438/127 |
| 2010/0261335 A1* | 10/2010 | Andry et al. | 438/462 |
| 2011/0068420 A1* | 3/2011 | Binder et al. | 257/415 |
| 2011/0318879 A1* | 12/2011 | Hatakeyama et al. | 438/114 |
| 2012/0074565 A1* | 3/2012 | Koroku | 257/737 |

FOREIGN PATENT DOCUMENTS

DE 197 30 028 1/1999

OTHER PUBLICATIONS

Amer Ms et al., <<Femlosecond versus nanosecond laser machining : comparison of induced stresses and structural changes in silicon wafers, >> Applied Surface Science, Elsevier, Amsterdam, NL LNKD-DOI :10.1016/JAPSUSC.2004.08.029, Bd. 242, No. 1-2, Mar. 31, 2005, pp. 162-187, XP025284852.

* cited by examiner

*Primary Examiner* — George Fourson III  
(74) *Attorney, Agent, or Firm* — Kenyon & Kenyon LLP

(57) ABSTRACT

A method for manufacturing separated micromechanical components situated on a silicon substrate includes the following steps of a) providing separation trenches on the substrate via an anisotropic plasma deep etching method, b) irradiating the area of the silicon substrate which forms the base of the separation trenches using laser light, the silicon substrate being converted from a crystalline state into an at least partially amorphous state by the irradiation in this area, and c) inducing mechanical stresses in the substrate. In one specific embodiment, cavities are etched simultaneously with the etching of the separation trenches. The etching depths can be controlled via the RIE lag effect.

9 Claims, 1 Drawing Sheet

METHOD FOR MANUFACTURING SEPARATED MICROMECHANICAL COMPONENTS SITUATED ON A SILICON SUBSTRATE AND COMPONENTS MANUFACTURED THEREFROM

FIELD OF THE INVENTION

The present invention relates to a method for manufacturing separated micromechanical components situated on a silicon substrate. Furthermore, the present invention relates to a micromechanical component which was manufactured by the foregoing method.

BACKGROUND INFORMATION

In the manufacture of micromechanical sensors having diaphragm structures of greatly varying functionality, the use of sawing to separate the chips of finished processed components represents a process known per se. For diaphragm manufacturing, in particular for microphones and pressure sensors, a cavity volume may be created on the rear side. In the case of closed diaphragms having a sealing function from the front side to the rear side and also a comparatively high mechanical stability, a conventional wafer sawing process may be applied without a particularly high risk of diaphragm damage. In the case of closed diaphragms, there is also not a high risk of irreversible sticking of the diaphragm to layers lying underneath when sawing from the wafer front side, as a result of the liquid media used during sawing for removing sawing slurry.

However, the conditions are different in the case of structured diaphragms. These diaphragms are no longer completely closed, since they are perforated, for example. Such structured diaphragms may be used, for example, for stress decoupling, since independence of the sensitivity from intrinsic layer stress parameters may be achieved via the design through suitable diaphragm geometries. Such design-related measures play, inter alia, a large role for the manufacturing of microphones at high reproducibility and yield, in order to achieve independence from layer parameters which are difficult to control, such as the intrinsic stress. However, the sealing function with respect to the wafer rear side is eliminated in such diaphragms, which complicates sawing using liquid media and entails a high risk for the component as a result of the penetration of liquid and contaminants into the capacitive pickup structure.

So-called "stealth dicing," also known as "Mahoh dicing," represents an alternative to classic wafer sawing for chip separation. The wafer material is amorphized using a laser beam, whereby mechanical stresses are induced in the wafer. The thus produced target breakpoints cause the separation of the chips upon expansion of the wafer on a film. In this method, there is effectively no excess material, so that it is no longer necessary to use liquid media to remove this material during the separation process. However, this method has the disadvantage that depending on the wafer thickness, multiple or even numerous laser scans are required. The wafer throughput thus drops and the costs of the method rise.

German patent document DE 197 30 028 C2 discusses a method for using an excimer laser to separate and process semiconductor chips precisely at the edges, the chips being produced in a group on a semiconductor substrate and made of AIII-BV compound semiconductors. The excimer laser operates in the range of $\leq 100$ fs pulse duration and $\leq 250$ nm wavelength. In the method, an initial cut, which is shorter than the total length of the separation line, is produced on a substrate edge by displacing the incidence area of the laser beam. The initial cut is oriented in the separation line direction of a substrate surface to be processed along the desired separation line, which is located in a cleavage plane corresponding to a crystallization direction of the semiconductor substrate. The initial cut is produced as a notch in such a way that it results in an independent cleavage procedure and thus the separation of the semiconductor chip in the separation line direction. It is disadvantageous therein that high power densities between $5 \times 10^{13}$ and $2 \times 10^{14}$ W/cm$^2$ are required to produce the initial cut according to the description.

SUMMARY OF THE INVENTION

Therefore, a method is proposed according to the present invention for manufacturing separated micromechanical components situated on a silicon substrate, including the following steps:
a) providing separation trenches on the substrate via an anisotropic plasma deep etching method;
b) irradiating the area of the silicon substrate which forms the base of the separation trenches using laser light, the silicon substrate being converted from a crystalline state into an at least partially amorphous state by the irradiation in this area;
c) inducing mechanical stresses in the substrate.

According to the exemplary embodiments and/or exemplary methods of the present invention, micromechanical components are components whose structures have dimensions in the range from $\geq 1$ μm to $\leq 2000$ μm in particular. As a result of the details of the manufacturing, they are typically carried by a silicon substrate or are at least partially constructed from a silicon substrate. The silicon substrate may be a silicon wafer, which may be a polycrystalline wafer or a monocrystalline wafer. Separating the components means that the substrate which previously carried a plurality of components has been divided in such a way that individual components or smaller groups of components are provided.

The method according to the present invention may be performed both as a separation method of components which have already been manufactured on a silicon substrate and also as a combination of a separation method with steps of a manufacturing method for these components.

In the method, step a) first relates to the etching of separation trenches, along which the substrate is later to be separated. For this purpose, an anisotropic plasma deep etching method is used. Such a method refers to an etching method which may provide, for example, trenches having a depth of $\geq 100$ μm to $\leq 800$ μm or $\geq 400$ μm to $\leq 700$ μm in a silicon substrate. The deep reactive ion etching (DRIE) method is mentioned as an example.

Step b) of the method includes the irradiation of the base of one or more separation trenches using laser light. The laser light may be irradiated from the side of the substrate on which the separation trenches were applied. It is also possible, however, that the base is irradiated from the rear side of the substrate. As a result of the laser irradiation, the irradiated area is amorphized, which goes along with a reduction of the mechanical strength. Through the absorption of the laser light, which may be infrared light having a wavelength of 1064 nm, the material heats up at this point. The heating area dimensions may be $\leq 4$ μm. The heating causes conversion of the material. As a result thereof, a volume increase also occurs at this point. The result is a target breakpoint in the wafer, at which the chips may be separated during expansion.

The final separation of the components occurs in step c). Mechanical stresses may be tensile stresses or bending stresses, for example. One way to induce them is by gluing the substrate onto a film with subsequent horizontal stretching of the film. As a final result, the wafer is separated by the mechanical stresses at the points which are specified by the amorphized areas of the separation trenches.

The method according to the present invention has the advantage that residues to be removed are essentially prevented. The anisotropic plasma deep etching method uses gaseous etching agents and gaseous reaction products are formed. The amorphization of the silicon substrate with subsequent separation by mechanical stresses does not require the removal of excess material.

In one specific embodiment of the method according to the present invention, the etching method in step a) is a method for anisotropic plasma etching of structures, which are defined by an etching mask, in a silicon substrate, by the alternating successive separate performance of etching steps and polymerization steps, which are controllable independently of one another, the silicon substrate being situated on a substrate electrode in a reactor, and a polymer, which is partially removed again during the following etching step, being applied during the polymerization step to the structures defined by the etching mask, and the etching steps being performed without polymer producers in the plasma, fluorinated hydrocarbons having an atomic ratio of fluorine to carbon in a range from $\geq 1:3$ to $\leq 3:1$ being used for the polymerization steps, the surfaces exposed by the preceding etching steps being covered using a fluorocarbon polymer, etching gases which provide fluorine being used for the etching steps, a high-frequency low power being applied to the substrate electrode during the etching steps.

Variants of these etching steps are also known as Bosch methods. Deep trenches having nearly vertical walls may be etched using such an etching method. The deviation of the trench walls from the vertical is typically no more than ±2°. For example, $C_4F_8$ or a mixture made of $CHF_3$ and argon may be used as substances which form polymers. The fluorocarbon polymer which is produced may be chlorine-free. For the etching steps, a mixture made of $SF_6$ and argon may be used. During the etching steps, the ion energy may be in a range from $\geq 1$ eV to $\leq 50$ eV, which may be $\geq 5$ eV to $\leq 30$ eV. During the polymerization steps, the ion energy may be in a range from $\geq 1$ eV to $\leq 10$ eV, which may be from $\geq 4$ eV to $\leq 6$ eV. Microwave radiation at powers from $\geq 100$ W to $\leq 1500$ W or from $\geq 300$ W to $\leq 1200$ W may be applied to the substrate electrode.

In a further specific embodiment of the method according to the present invention, the laser light in step b) has a power of $\geq 0.7$ W to $\leq 1.2$ W. The laser power may also be in a range from $\geq 0.8$ W to $\leq 1.1$ W. Furthermore, a variation of the laser power during operation by ±0.02 W is also included in the present invention. At such laser powers, the amorphization of the substrate material may be limited to the separation trenches.

In a further specific embodiment of the method according to the present invention, cavities are etched simultaneously as part of the micromechanical components in the silicon substrate at the same time as the etching of separation trenches in step a). Examples of components having cavities or hollow spaces are microphones or pressure sensors. The desired etching depth during the plasma etching may be established via the RIE lag factor, which was previously established for the particular etching formula, by the selection of the lateral dimensions of the separation trenches. This reactive ion etching lag factor states that in this etching method, the etching speed is lower for trenches in the case of a small trench width than the etching speed in the case of a greater trench width. The separation trenches are dimensioned for this purpose in such a way that they are narrower than the cavities.

As a result, the separation trenches are also etched less deeply than the cavities. In the case of the known and previously characterized RIE lag effect, it may also be pre-established by the selection of the trench width relative to the cavity width how deep each of the separation trenches is etched in the silicon during the simultaneous application of the cavities. The depth of the separation trenches may be set in such a way that after the etching step the silicon substrate is still stable and may be handled without risk of fracture in the further course of manufacturing.

It is advantageous in this specific embodiment in particular that the separation trenches are applied in a method step to be performed in any case for the structuring of the cavities. A further etching step is thus not required. The silicon substrate is so thin in the area of the separation trenches that in the best case laser irradiation must only be performed once to achieve sufficient amorphization. The reduced cutting depth of the laser process results in significantly reduced processing times and processing costs. As a result of the possibility of defining the depth and width of the separation trenches by the RIE lag effect during the etching process for the cavities and also of the mask geometry, above all via the width of the separation trenches, almost any chip size and etching depth are possible. A high design freedom is thus provided and the separation process becomes independent of complex facility changes, as would be required, for example, in the event of a change between saw blades of a conventional wafer saw using different cutting widths.

Furthermore, it is possible that the cavities are at least partially covered by diaphragms. A diaphragm may be a microphone diaphragm or a pressure sensor diaphragm, for example. The diaphragm may be structured, i.e., it may have interruptions such as holes, for example. The method according to the present invention is particularly suitable for components having diaphragms, since sensitive diaphragm areas are not damaged by mechanical actions during the separation process and protective covers against liquid and material deposits may be eliminated. The cavities may advantageously have a width of $\geq 50$ μm to $\leq 2000$ μm or $\geq 400$ μm to $\leq 1000$ μm. The separation trenches may have a width of $\geq 1$ μm to $\leq 100$ μm or $\geq 10$ μm to $\leq 30$ μm. Furthermore, the width of the cavities and the width of the separation trenches may be in a ratio of $\geq 5:1$ to $\leq 50:1$ or $\geq 10:1$ to $\leq 30:1$. At these relative width ratios, the depth ratio of the cavity and separation trenches may be set favorably in commercially available silicon wafers. Different etching depths may thus be controlled via the ratio of the lateral dimensions.

Furthermore, an object of the exemplary embodiments and/or exemplary methods of the present invention is a micromechanical component, manufactured by a method according to the present invention.

In one specific embodiment of the micromechanical component, the component includes a diaphragm. The material of the diaphragm or the functional diaphragm layer may include, for example, amorphous, monocrystalline or polycrystalline silicon, silicon germanium (SiGe), metals, in particular aluminum, and metal oxides or metal nitrides.

In a further specific embodiment of the micromechanical component, the component is selected from the group including microphones, pressure sensors, micromirrors, and/or biochemical sensors having porous diaphragm areas.

The present invention is explained in greater detail on the basis of the following drawings.

DETAILED DESCRIPTION

Figure 1:
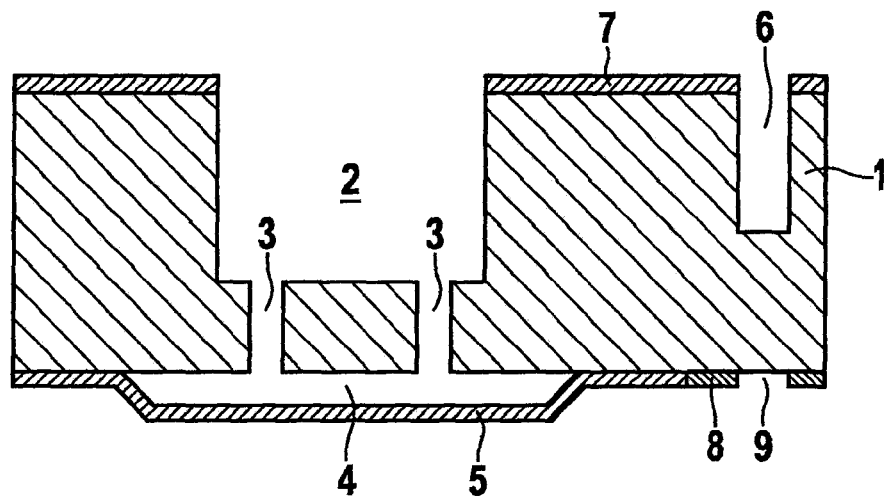
FIG. 1 shows a structured silicon wafer.

FIG. 1 shows a structured silicon wafer after the anisotropic plasma deep etching step. Silicon substrate 1 has been etched in such a way that cavity 2, perforation holes 3 through substrate 1, and hollow space 4 between substrate 1 and diaphragm 5 have been constructed. Furthermore, separation trenches 6 were applied at the same time as the etching of cavity 2. Cavity 2 and separation trenches 6 may fundamentally be produced having vertical side walls by the anisotropic etching process. Separation trench 6 is produced having a lesser etching depth than cavity 2 by utilizing the RIE lag effect. Residues of a masking layer 7 are still located on the side of substrate 1 facing away from the diaphragm. The surface of substrate 1 on the diaphragm side is partially covered by a further masking layer 8 at the points at which no diaphragm 4 is located. This masking layer 8 is interrupted by an unmasked area 9, however. Unmasked area 9 is in the extension of separation trench 6 and finally also forms its base. Because the depth of separation trench 6 does not include the entire wafer cross section, a separate wafer receptacle in the form of a film or a carrier substrate is not required for further handling of the wafer. This in turn has the advantage that in contrast to the subsequent dissolving of possible protective layers for diaphragm 5 or other carrier areas from the front side, the areas around diaphragm 5 are not able to be damaged.

Figure 2:
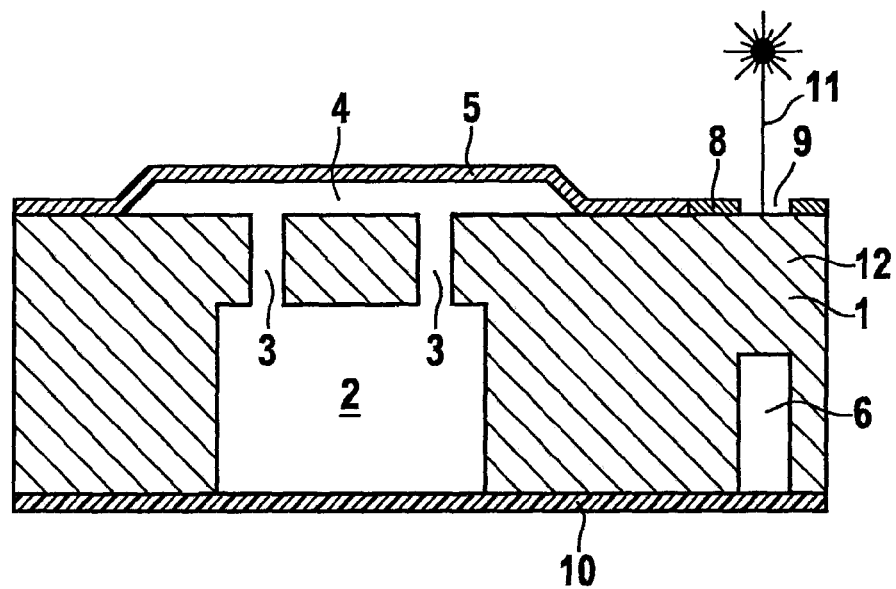
FIG. 2 shows the silicon wafer from FIG. 1 during the laser cutting.

FIG. 2 shows the silicon wafer from FIG. 1 during the laser cutting. In relation to the illustration in FIG. 1, masking layer 7 was removed and the silicon wafer was provided on its rear side with a film 10 for the subsequent accommodation of the single chip. In this way, it may pass through all further packaging stations as usual using existing equipment. Unmasked area 9 of the wafer surface on the diaphragm side is irradiated using a laser beam 11. The silicon substrate in this area 9 and lower lying material 12 are amorphized by the action of laser beam 11. Since there is no excess material to be removed in the case of the amorphization of the silicon material from the wafer front side up to the depth at which rear applied separation trenches 6 end, liquid media for material removal or wafer cooling are also not required. After the expansion of film 10, the components are provided in separated form, the separation lines running along previously applied separation trenches 6.

What is claimed is:
1. A method for manufacturing separated micromechanical components, which are situated on a silicon substrate, the method comprising::
   a) providing separation trenches on the substrate via an anisotropic plasma deep etching process;
   b) irradiating an area of the silicon substrate, which forms a base of the separation trenches, using laser light, wherein the silicon substrate is converted from a crystalline state into an at least partially amorphous state by the irradiation in this area; and
   c) inducing mechanical stresses in the substrate;
   wherein, during the etching of separation trenches in a), cavities are etched simultaneously as part of the micromechanical components in the silicon substrate.

2. The method of claim 1, wherein the etching process in a) is a process for anisotropic plasma etching of structures which are defined using an etching mask in a silicon substrate through the alternating successive separate performance of etching operations and polymerization operations, which are controllable independently of one another, wherein the silicon substrate is situated on a substrate electrode in a reactor, and a polymer, which is partially removed again during the following etching operation, is applied during the polymerization operation to the structures which are defined by the etching mask, and the etching operations are performed without polymer producers in the plasma, fluorinated hydrocarbons having an atomic ratio of fluorine to carbon in a range from $\geq 1:3$ to $\leq 3:1$ are used for the polymerization operations, the areas which are exposed by the preceding etching operations are covered using a fluorocarbon polymer, etching gases which provide fluorine are used for the etching operations, and a high-frequency low power is applied to the substrate electrode during the etching operations.

3. The method of claim 1, wherein the laser light in b) has a power of $>0.7$ W to $<1.2$ W.

4. The method of claim 1, wherein the cavities are at least partially covered by diaphragms.

5. The method of claim 1, wherein the cavities have a width of $\geq 50$ μm to $\leq 2000$ μm.

6. The method of claim 1, wherein the width of the cavities and the width of the separation trenches are in a ratio of $\geq 5:1$ to $\leq 50:1$.

7. The method of claim 1, wherein the etching process in a) is a process for anisotropic plasma etching of structures which are defined using an etching mask in a silicon substrate through the alternating successive separate performance of etching operations and polymerization operations, which are controllable independently of one another.

8. The method of claim 7, wherein the silicon substrate is situated on a substrate electrode in a reactor, and a polymer, which is partially removed again during the following etching operation, is applied during the polymerization operation to the structures which are defined by the etching mask.

9. The method of claim 8, wherein the etching operations are performed without polymer producers in the plasma, fluorinated hydrocarbons having an atomic ratio of fluorine to carbon in a range from $\geq 1:3$ to $\leq 3:1$ are used for the polymerization operations, the areas which are exposed by the preceding etching operations are covered using a fluorocarbon polymer, etching gases which provide fluorine are used for the etching operations.

* * * * *